United States Patent [19]

Hisa

[11] Patent Number: 4,801,991
[45] Date of Patent: Jan. 31, 1989

[54] SEMICONDUCTOR LIGHT RECEIVING DEVICE

[75] Inventor: Yoshihiro Hisa, Itami, Japan

[73] Assignee: Mitsubishi Denki Kabushiki Kaisha, Japan

[21] Appl. No.: 108,076

[22] Filed: Oct. 14, 1987

[30] Foreign Application Priority Data

Jul. 17, 1987 [JP] Japan ................................. 62-179620

[51] Int. Cl.[4] ..................... H01L 27/14; H01L 27/22; H01L 29/06
[52] U.S. Cl. ........................................ 357/30; 357/27; 357/20; 357/47; 357/81
[58] Field of Search ................. 357/30 G, 30 H, 30 I, 357/30 L, 30 Q, 24, 27, 20, 47, 81

[56] References Cited

U.S. PATENT DOCUMENTS

| | | | |
|---|---|---|---|
| 3,863,070 | 1/1975 | Wheeler et al. | 357/23.1 |
| 3,906,359 | 9/1975 | Blaha et al. | 357/27 |
| 4,039,833 | 8/1977 | Thom | 357/30 Q |
| 4,115,692 | 9/1978 | Balcerak et al. | 357/30 G |
| 4,369,458 | 1/1983 | Thomas et al. | 357/30 Q |

FOREIGN PATENT DOCUMENTS

| | | | |
|---|---|---|---|
| 58-131765 | 8/1983 | Japan | 357/30 I |
| 60-42878 | 3/1985 | Japan | 357/30 I |
| 61-141175 | 6/1986 | Japan | . |
| 62-36858 | 2/1987 | Japan | . |

Primary Examiner—J. Carroll
Assistant Examiner—Ngan Van Ngo
Attorney, Agent, or Firm—Leydig, Voit & Mayer

[57] ABSTRACT

A semiconductor light receiving device comprising: a light receiving section obtained by arranging a plurality of light receiving elements having pn junctions in an array on a semiconductor substrate; a signal taking out section for taking out an electric signal obtained at the light receiving section; and a member for applying a magnetic field having a component in a direction vertical with the surface of the semiconductor substrate to the light receiving section.

10 Claims, 5 Drawing Sheets

SEMICONDUCTOR LIGHT RECEIVING DEVICE

FIELD OF THE INVENTION

The present invention relates to a semiconductor light receiving apparatus, and more particularly to that which is capable of obtaining a two dimensional video information, comprising a plurality of light receiving elements having pn junctions in an array on a semiconductor substrate.

BACKGROUND ART

FIG. 8 shows a cross-sectional view of a prior art semiconductor light detector shown in such as Japanese Patent Laid Open Publication No. 61-141175. In FIG. 8, the reference numeral 1 designates an N type region, and this region is produced by an epitaxial growth on a high resistance $N^-$ region 2 which has resistivity of 10 $\Omega$cm. The reference numeral 3 designates a $P^+$ region, and a pn junction section 4 which becomes a light receiving surface is produced by producing this $P^+$ region. The reference numeral 5 designates a polycrystalline semiconductor region provided so as to separate the respective pn junction sections 4. The reference numeral 6 designates a protection film, and the reference numeral 7 designates a rear surface electrode. Besides, an ohmic electrode which is to be provided on the $P^+$ region 3 is not shown because it is well known.

Prior to describing the semiconductor light detector of the above described structure, the problems in a semiconductor light detector comprising a plurality of light receiving elements arranged in an array will be described.

FIG. 9 shows a cross-section of such a semiconductor light detector. In FIG. 9, the reference numeral 11 designates a P type semicondcutor substrate, the reference numeral 13 designates an N type impurities dopes layer, the reference numeral 14 designates a pn junction section constituting a light receiving element, the reference numeral 16 designates a protection film, the reference numeral 17 designates a rear surface electrode, the reference numeral 20 designates a carrier generated by an incident light, and reference numerals 21 and 22 designate the proceeding directions of the carrier 20.

Only the photons incident on and having energy levels longer than the band gap energies of either the P type semiconductor substrate 11 or the N type impurities doped layer 13 generate carriers. The generated carriers are drifted by the electric field in the depletion layer at the neighbourhood of the pn junction section 14, thereby being separated to produce a voltage difference. Then, there arises a problem of cross-talk that the light incident to a region between adjacent photo diodes causes mutual interferences between the elements. This cross-talk is caused by the generation of electron hole pairs at a deep portion of the P type semiconductor substrate 11 when light having a small absorption coefficient is incident. For example, the carriers 20 generated by the incident light proceed not only in the direction 21 but also in the direction 22 to reach the adjacent picture element. Such cross-talk makes the positional boundary at a position sensor less distinct, and makes unclear the distinctions between adjacent signal peaks in an analysis sensor.

Noticing these problems, in the prior art semiconductor light detector, a polycrystalline semiconductor region 5 is provided between the pn junction sections 4, that is, between adjacent picture elements, thereby separating the respective picture elements. Furthermore in order to get rid of cross-talk of carriers at deep portions, a high resistance $N^-$ region 2 having a high resistivity of 10 $\Omega$cm is provided as shown in FIG. 8. The lifetime of carriers at said $N^-$ region 2 is quite short, and therefore they all disappear before they reach the N type region 1.

In the prior art semiconductor light detector constituted in such a manner, as apparent from FIG. 8 the structure is very complicated, and therefore the production process becomes a complicated one. Furthermore, the distance between consecutive picture elements is restricted because there is a separation region, and the size of the device inevitably increases. Furthermore, it is impossible to reduce the inter-picture element region which is insensitive to the incident light, and there arises a restriction in the function while operating as an analysis sensor.

SUMMARY OF THE INVENTION

An object of the present invention is to provide an improved semiconductor light receiving device capable of preventing cross-talk by quite a simple construction, capable of being operated as an analysis sensor by getting rid of the insensitive region, and capable of reducing the size of the device.

Other objects and advantages of the present invention will become apparent from the detailed description given hereinafter. It should be understood, however, that the detailed description and specific embodiment are given by way of illustration only, and that various changes and modifications within the spirit and scope of the invention will become apparent from this detailed description to those skilled in the art.

According to the present invention, a magnetic field having a component in the direction perpendicular to the surface of a semiconductor substrate is applied to a light receiving section formed to a plurality of light receiving elements arranged in an array on the semiconductor substrate, whereby the movement of carriers is restricted by the function of the above-described magnetic field. Thus, generation of cross-talk is prevented.

DETAILED DESCRIPTION OF THE PREFERRED EMBODIMENTS

Figure 1:
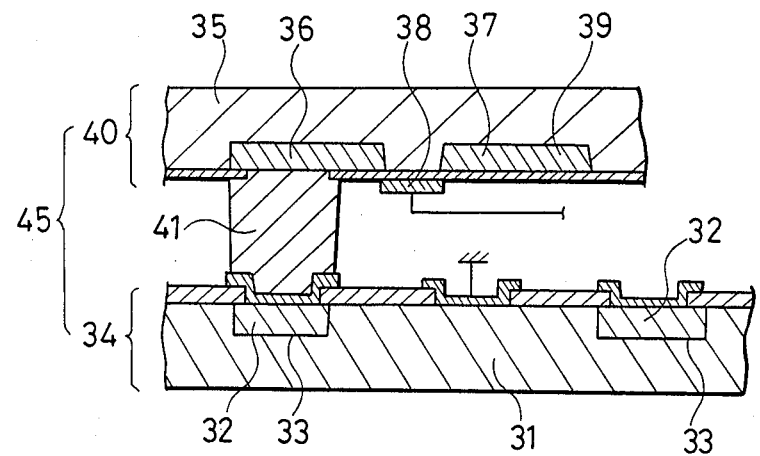
FIGS. 1 and 2 are a main portion cross-sectional view and an entire portion cross-sectional view showing an infrared rays detector according to a first embodiment of the present invention.
Figure 2:
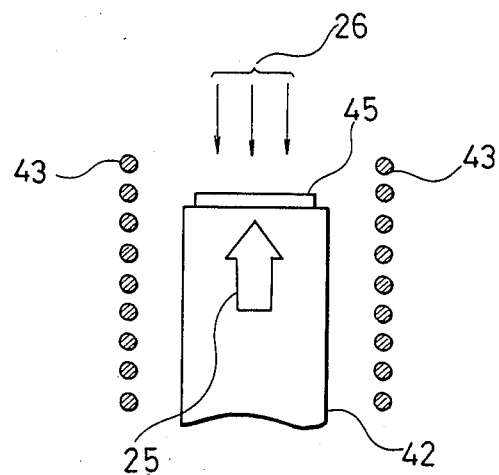

In order to explain the present invention in detail, reference will be particularly made to FIGS. 1 and 2.

In FIG. 1, the reference numeral 45 designates an infrared rays detector comprising a light receiving section 34 for converting the input light signal into an electric signal and a signal taking out section 40 for taking out an electric signal obtained at the light receiving section 34. In the light receiving section 34, the reference numeral 31 designates a P type semiconductor substrate comprising HgCdTe, and this HgCdTe material has an energy band gap of about 0.12 eV and has an ability of mainly detecting infrared rays of wavelength 10 μm. The reference numeral 32 designates a plurality of N type semiconductor layers arranged in an array on the semiconductor substrate 31 and formed by impurity doping. The reference numeral 33 designates a pn junction section constituting a light receiving element.

Furthermore, in the signal taking out section 40, the reference numeral 35 designates a silicon substrate, the reference numerals 36, 37, and 38 designate the source, a drain, and gate of a transfer gate, and the reference numeral 39 designates a CCD (Charge Coupled Device). Herein, this transfer gate and CCD are produced on a silicon substrate 35 because they are difficult to produce in a HgCdTe material.

Furthermore, the reference numeral 41 designates electrode for connecting the light receiving element of the light receiving section 34 and the transfer gate of the signal taking out section 40.

Furthermore, in FIG. 2, the reference numeral 42 designates a cooler, and that cools the HgCdTe material of the substrate 31 to about −196° C. to make it function as a semiconductor, which material shows nearly the same electrical properties as metals at the normal temperature because of its small band gap at that temperature.

The reference numeral 43 designates a member, herein shown as a coil for applying a magnetic field 25, the intensity of which can be adjusted. The reference numeral 26 designates the infrared rays.

The present invention, aimed at restricting the movements of carriers by applying a magnetic field to the light receiving section in a direction perpendicular to the light receiving section. The principle of restricting the movements of carriers will be described with reference to FIG. 3.

At first, suppose the kinetic energy is given by the heat energy, the kinetic energy of a carrier in the P type semiconductor substrate 31 is given by the following formula.

$$\frac{3}{2} kT = \frac{1}{2} m^* v^2 \tag{1}$$

k: Boltzmann's constant
T: absolute temperature
m*: effective mass of a carrier
v: velocity The velocity of a carrier can then be represented by the following formula, $$v = \sqrt{\frac{3kT}{m^*}} \tag{2}$$

The carrier velocity in the magnetic field satisfies the following kinetic equation.

$$\frac{dv}{dt} = -\frac{e}{m} (\vec{v} \times \vec{B}) \tag{3}$$

B: magnetic flux density

Now, suppose that the direction perpendicular to the P type semiconductor substrate 31 is the z axis, and that the direction of the magnetic flux $\vec{B}$ is also taken in the positive direction of the z axis, then the following equalities are established.

$$\left.\begin{array}{l} \frac{d^2x}{dt^2} = -\frac{e}{m} \frac{dy}{dt} B_z \\ \frac{d^2y}{dt^2} = \frac{e}{m} \frac{dx}{dt} B_z \\ \frac{d^2z}{dt^2} = 0 \end{array}\right\} \tag{4}$$

That is, carriers are not accelerated in the z direction, and accelerations occur only along with only the x and y directions.

When accelerations of carriers are made such that dx/dt=v, dy/dt=0, the orbits of carriers become $$x^2 + \left(y - \frac{m^* v}{eB_z}\right)^2 = \left(\frac{m^* v}{eB_z}\right)^2 \tag{5}$$

Equation (5) is the equation of a circle having a radius r=m*v/eBz.

Substituting v in equation (5) by equation (2), equation (5) yields the following formula $$r = \frac{\sqrt{3kTm^*}}{eB_z} \tag{6}$$

Therefore, when a magnetic field is applied in a direction perpendicular to the light receiving section, carriers under-go a circular motion, thereby restricting the movements of carriers.

Figure 3:
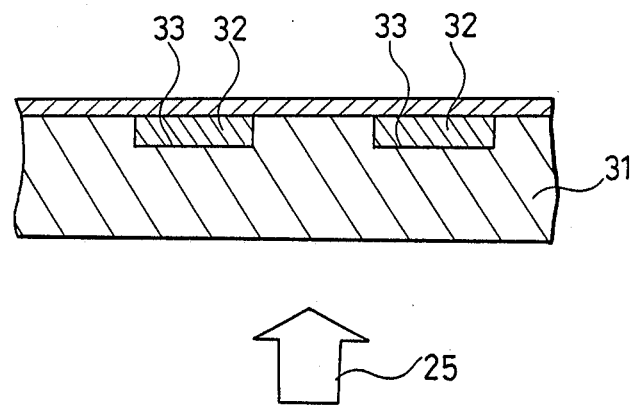
FIG. 3 is a cross-sectional view showing the light receiving section of the first embodiment and exemplifying the principle that the movement of carriers is restricted by the magnetic field.

Next, formula (6) is applied to a concrete example. For example, when the area of the N type semiconductor layer 32 in the P type semiconductor substrate surface 31 of FIG. 3 is made 25×25 μm² and the distance between consecutive N type semiconductor layers 32 is made 25 μm, cross-talk will arise easily because the diffusion length of minority carriers in the P type semiconductor substrate 31 is about 50 μm. However, when a magnetic field 25 of 0.1 Wb/m² is applied, the effective mass m* of the carrier becomes 0.01×9.1×10⁻³¹ kg, and when it is operated at a temperature of 77 K., equation (6) becomes $$r = \frac{\sqrt{3 \times 1.38 \times 10^{-23} \times 77 \times 0.01 \times 9.1 \times 10^{-31}}}{1.6 \times 10^{-19} \times 0.1}$$

$$= 3.36 \times 10^{-7} m$$

and the radius of the circular motion becomes 0.336 μm.

Herein, when a magnetic field 25 is applied to the light receiving section 34, this magnetic field may have an unfavorable effects upon the CCD 39 of the signal taking out section 40. However the intensity of the magnetic field 25 can be adjusted according to the physical properties of the material of the substrate of the light receiving section substrate 31 and that of the CCD substrate 35. Such properties include the effective mass of carriers, mobility, and the like. The adjusted value of the magnetic field results in desired effects at the light receiving section 34 causing unfavorable effects upon the CCD substrate 35.

In the above-illustrated embodiment, the movements of carriers are restricted by the magnetic field 25 applied by the coil 43, whereby cross-talk is prevented. Furthermore, carriers generated between adjacent elements can reach the pn junction sections of either of the elements, thereby getting rid of insensitive regions, resulting in an enhancement of the sensing property. Furthermore, as there is no separation region between consecutive picture elements, the structures can be simplified, and the size of the device can be reduced.

Furthermore, as the intensity of the magnetic field generated by the coil 43 is adjustable, the detector can be adjusted in accordance with its use. For example, a device in which cross-talk is completely removed remaining unsensitive insensitive regions a little, or a device in which insensitive regions are completely removed with remaining cross-talks a little can be obtained with or without the presence of small insensitive regions.

Furthermore, in the above-illustrated embodiment, the cooler 42 can be contained in the coil 43, and this makes the entire device compact.

In the above-illustrated embodiment HgCdTe material is used as the P type semiconductor substrate 31 for detecting infrared rays. However if a material different from the substrate material of the signal taking out section and having an energy band gap corresponding to the wavelength of the light to be detected can be used as a substrate material, a semiconductor light receiving device which can detect different wavelengths of light can be obtained with the same effects as described above.

In the above-illustrated embodiment the signal taking out section 40 is of a CCD type provided with transfer gates and CCDs 39, but this may be of MOS switch type provided with transfer gates only gates.

Figure 4:
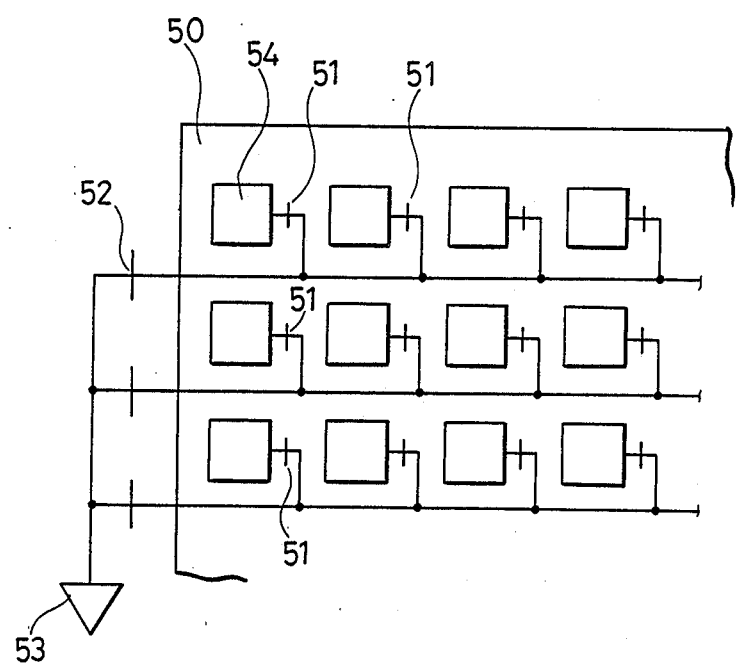
FIG. 4 is a plan view showing a semiconductor light receiving device according to a second embodiment of the present invention.

FIG. 4 shows a semiconductor light receiving device according to a second embodiment of the present invention. In FIG. 4, reference numeral 50 designates a substrate of the light receiving section, reference numeral 51 designates a transfer gate provided at the respective light receiving element 54, reference numeral 52 designates a transfer gate provided at the outside of the substrate 50 at each column of the respective light receiving element 54, and reference numeral 53 designates an amplifier.

The second embodiment is constructed by providing a signal taking out section of MOS switch type which includes only transfer gates on the same substrate as the light receiving section, and the taking out of electric signals of the respective light receiving elements is conducted only by using the transfer gates 51 and 52 without using CCDs.

In the second embodiment, similar to the first embodiment, it is possible to apply a magnetic field in the direction perpendicular to the substrate 50 to prevent the occurrence of cross-talk and to accomplish the reduction of the device size and the enhancement of the device property.

Furthermore, the second embodiment does not include CCDs, and it is possible to apply a magnetic field without being subjected to restriction due to unfavorable effects upon the CCDs. Moreover, only one substrate is required and the device can be miniaturized.

Figure 5:
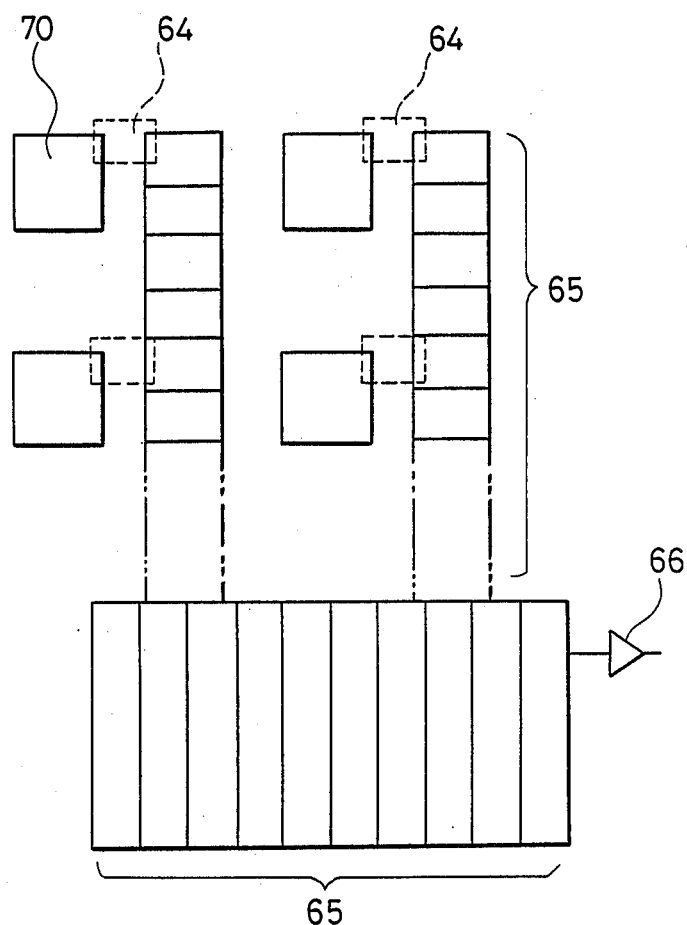
FIG. 5 is a plan view showing a semiconductor light receiving device according to a third embodiment of the present invention.

FIG. 5 shows a semiconductor light receiving device according to a third embodiment of the present invention. In FIG. 5 reference numeral 64 designates a transfer gate, reference numeral 65 designates a CCD, reference numeral 66 designates an amplifier, and reference numeral 70 designates a light receiving element. The third embodiment is constructed by providing a signal taking out section of CCD type provided with transfer gates and CCDs on the same substrate as the light receiving section, and the taking out of electric signals of the light receiving elements is conducted by the transfer gate 64 and the CCD 65.

In the third embodiment, similar to the above-illustrated embodiments, occurrence of cross-talk is prevented by applying a magnetic field in a direction perpendicular to the substrate surface, and reduction of the device size and the enhancement of the device properties can be obtained.

Figure 6:
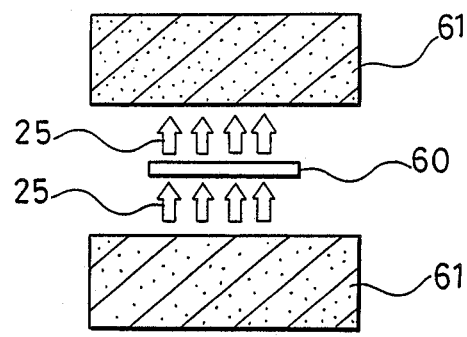
FIG. 6 is a side view showing a semiconductor light receiving device according to a fourth embodiment of the present invention.

FIG. 6 shows a semiconductor light receiving device as a fourth embodiment of the present invention in which a permanent magnet 61 is used as a means for applying a magnetic field 25 to the semiconductor light receiving device 60. The permanent magnet may be provided at either of the upper or lower surfaces of the semiconductor light receiving device.

Figure 7:
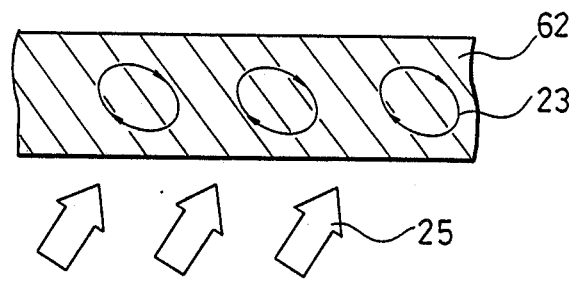
FIG. 7 is a side view showing a light receiving section substrate of a semiconductor light receiving device according to a fifth embodiment of the present invention.
Figure 8:
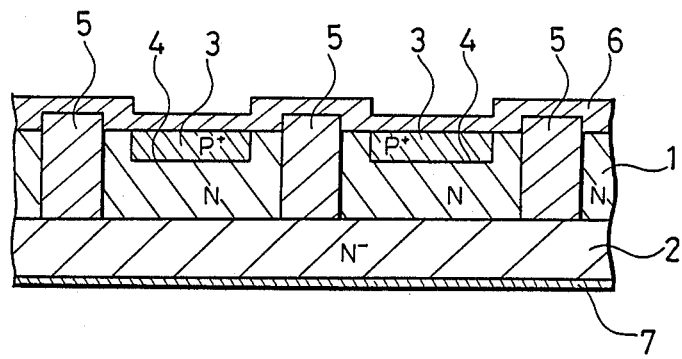
FIGS. 8 and 9 are side sectional views showing a prior art semiconductor light receiving device, respectively.
Figure 9:
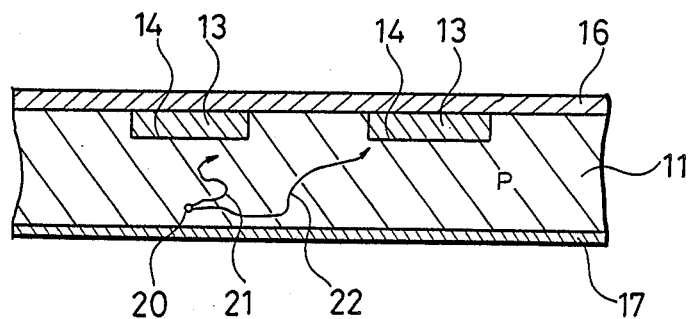

FIG. 7 shows a semiconductor light receiving device according to a fifth embodiment of the present invention. The fifth embodiment is constituted in such a manner that a magnetic field 25 is applied to the semiconductor substrate 62 of the light receiving section in a direction at an acute angle with said substrate surface. In this embodiment, although the movements of carriers in the transverse direction become large to some extent because the vertical component of the magnetic field becomes small as shown by an arrow 23, the carriers move also in the longitudinal direction, and the probability of carriers reaching the pn junction section at the surface of the substrate 62 will be increased.

As is evident from the foregoing description, according to the present invention, a magnetic field having a component in a direction perpendicular to the semiconductor substrate surface is applied to the light receiving section which is constituted by arranging a plurality of light receiving elements in an array on a semiconductor substrate. Thus, cross-talk can be prevented in a simple construction, the separation regions are removed, thereby reducing the size of the device, and the insensitive regions are removed, thereby enhancing the device properties.

What is claimed is:

1. A semiconductor light receiving device comprising:

a light receiving section obtained by arranging a plurality of light receiving elements having pn junctions in an array on a surface of a semiconductor substrate;

a signal taking out section for taking out an electric signal obtained at said light receiving section; and a means for applying a magnetic field to said light receiving section, the magnetic field having a direction providing a component perpendicular to the surface of said semiconductor substrate and having an intensity to restrict movement of current carriers in the semiconductor substrate to orbits in planes normal to the direction of the magnetic field and substantially prevent generation of cross-talk between the plurality of light receiving elements.

2. A semiconductor light receiving device as defined in claim 1 wherein said magnetic field applying means comprises an electromagnet, and the intensity of the magnetic field thereof is adjustable.

3. A semiconductor light receiving device as defined in claim 1 wherein said magnetic field applying means applies a magnetic field in a direction at an acute angle with the surface of said semiconductor substrate.

4. A semiconductor light receiving device as defined in claim 2, wherein said magnetic field applying means applies a magnetic field in a direction diagonal with the surface of said semiconductor substrate.

5. A semiconductor light receiving device as defined in claim 1 wherein said light receiving section and signal taking out section are produced on different semiconductor substrates, respectively, which comprise different materials.

6. A semiconductor light receiving device as defined in claim 5 wherein said semiconductor light receiving device is an infrared rays detector, and the semiconductor substrate of said light receiving section comprises HgCdTe, and the semiconductor substrate of said signal taking out section comprises silicon.

7. A semiconductor light receiving device as defined in claim 6 wherein said magnetic field applying means comprises an electromagnet, and a cooler for cooling said light receiving section is provided inside a coil of said electromagnet.

8. A semiconductor light receiving device as defined in claim 6 wherein said signal taking out section is of MOS switch type including only transfer gates.

9. A semiconductor light receiving device as defined in claim 6 wherein said signal taking out section is of CCD type including transfer gates and CCDs.

10. A semiconductor light receiving device comprising:

a light receiving section obtained by arranging a plurality of light receiving elements having pn junctions in an array on a surface of a semiconductor substrate;

a signal taking out section for taking out an electric signal obtained at said light receiving section; and a member applying a magnetic field to said light receiving section, the magnetic field having a direction providing a component perpendicular to the surface of said semiconductor substrate and having an intensity restricting movement of current carriers in the semiconductor substrate to orbits in planes normal to the direction of the magnetic field and which substantially prevent generation of cross-talk between the light receiving elements.

* * * * *